(12) United States Patent
Zipser et al.

(10) Patent No.: US 7,872,434 B2
(45) Date of Patent: Jan. 18, 2011

(54) ELECTRIC MOTOR

(75) Inventors: Thomas Zipser, St. Georgen-Peterzell (DE); Jens Loffler, St. Georgen-Brigach (DE)

(73) Assignee: EBM-Papst St. Georgen GmbH & Co. KG, St. Georgen (DE)

( * ) Notice: Subject to any disclaimer, the term of this patent is extended or adjusted under 35 U.S.C. 154(b) by 216 days.

(21) Appl. No.: 11/993,165

(22) PCT Filed: Mar. 20, 2007

(86) PCT No.: PCT/EP2007/002434

§ 371 (c)(1),
(2), (4) Date: Dec. 19, 2007

(87) PCT Pub. No.: WO2007/140832

PCT Pub. Date: Dec. 13, 2007

(65) Prior Publication Data

US 2010/0219782 A1 Sep. 2, 2010

(30) Foreign Application Priority Data

Jun. 3, 2006 (DE) .................. 20 2006 009 033 U

(51) Int. Cl.
*H02P 6/00* (2006.01)
(52) U.S. Cl. ................... 318/400.26; 318/400.21
(58) Field of Classification Search ............ 318/400.01, 318/400.26, 400.3, 400.37, 400.38, 546, 318/700, 720–724
See application file for complete search history.

(56) References Cited

U.S. PATENT DOCUMENTS

| | | | |
|---|---|---|---|
| 6,392,372 B1 * | 5/2002 | Mays, II ................ | 318/400.01 |
| 6,452,349 B1 | 9/2002 | Hahn et al. ................ | 318/254 |
| 6,731,086 B2 | 5/2004 | Nonaka ................ | 318/459 |
| 7,482,770 B2 * | 1/2009 | Beifus ................ | 318/254.1 |
| 2002/0180391 A1 | 12/2002 | Nonaka ................ | 318/459 |
| 2003/0080772 A1 * | 5/2003 | Giacomini et al. .......... | 324/771 |

FOREIGN PATENT DOCUMENTS

DE 199 49 804 A1 5/2000

OTHER PUBLICATIONS

Anachip Corp., Taiwan:"AH287 High Voltage Hall-Effect Smart Fan Motor Controller," 7 pp. © 2005.
Texas Instr., Dallas TX, "UC3625 Brushless DC Motor Controller IC," 11 pp., © 2005.
Prolific Technology, Taiwan, PT3911 Mixed-Mode Hall IC Motor Driver, 3 pp. © 2003.

* cited by examiner

*Primary Examiner*—Bentsu Ro
(74) *Attorney, Agent, or Firm*—Milton Oliver, Esq.; Oliver Intellectual Property LLC

(57) ABSTRACT

An electronically commutated electric motor (110) has a permanent-magnet rotor (28), a stator having a stator winding arrangement (40), a motor control module (20) implemented as an IC and having a control logic unit (27), and an external power stage (50), separate from the IC, for influencing the current flow in the stator winding arrangement (40). The motor control module (20) has an internal power stage (29) having at least one open collector output (21, 23). The control logic unit (27) is configured to process a rotor position signal (24', 24") and to generate therefrom control signals (27') for the internal power stage (29), which control signals (27') serve to apply control to the internal power stage (29). Using an external power stage (50) reduces vulnerability to motor overheating and provides design flexibility.

25 Claims, 3 Drawing Sheets

ELECTRIC MOTOR

CROSS-REFERENCE

This application is a section 371 of PCT/EP2007/02434 filed 20 Mar. 2007 and published as WO 2007-140832-A1 on 13 Dec. 2007.

FIELD OF THE INVENTION

The present invention relates to an electronically commutated motor (ECM) which has reduced vulnerability to overheating.

BACKGROUND

Integrated motor control modules exist that have an internal power stage for direct connection of at least one stator strand of an ECM. Because of the heat generated in the internal power stage of this module, such modules have the disadvantage that they have little power reserve at high outside temperatures, i.e. they then enable only a low motor power level, or operation of the motor is then no longer possible at all. This is referred to as "derating," i.e. the maximum power output or "rating" depends on the ambient temperature of the motor module, and decreases or becomes more or less limited with increasing temperature.

SUMMARY OF THE INVENTION

It is therefore an object of the invention to make available a new ECM that can be operated even at higher ambient temperatures.

According to the invention, this object is achieved by an ECM in which there is an internal integrated control module having an open collector output, an external power stage for influencing current flow in the motor stator, and an inversion logic unit which reshapes an output signal from the open collector output, for the purpose of generating commutation signals for the external power stage.

A motor of this kind can be operated even at higher temperatures. The combination of an internal power stage, inversion logic unit, and external power stage enables a plurality of circuit variants with which, for example, the switching speed of the power stage can be influenced and adapted to the corresponding application for which the motor will be used.

BRIEF FIGURE DESCRIPTION

Further details and advantageous refinements of the invention are evident from the exemplifying embodiments, in no way to be understood as a limitation of the invention, that are described below and depicted in the drawings.

Figure 1:
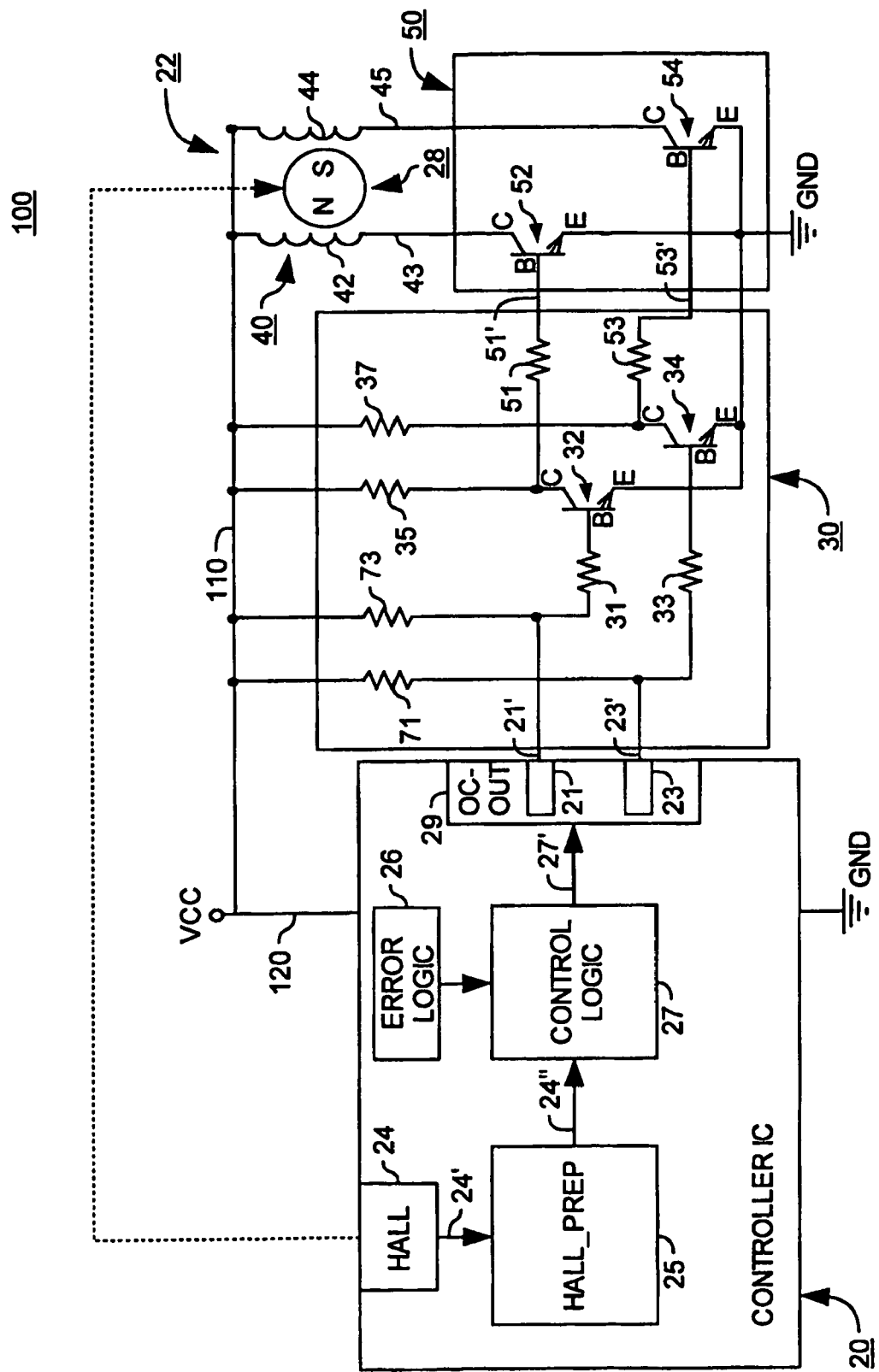
FIG. 1 is a circuit diagram of an apparatus for operating an electric motor, according to an embodiment of the invention.
Figure 2:
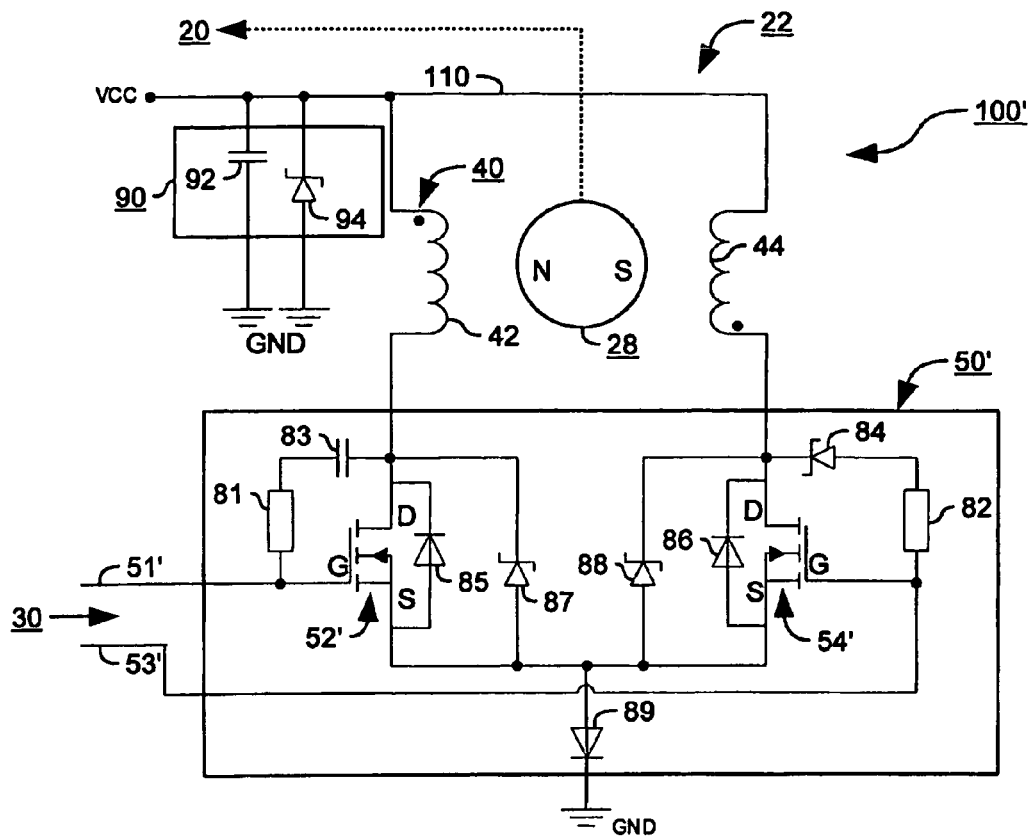
FIG. 2 is a circuit diagram of the external power stage of FIG. 1, according to another embodiment of the invention.
Figure 3:
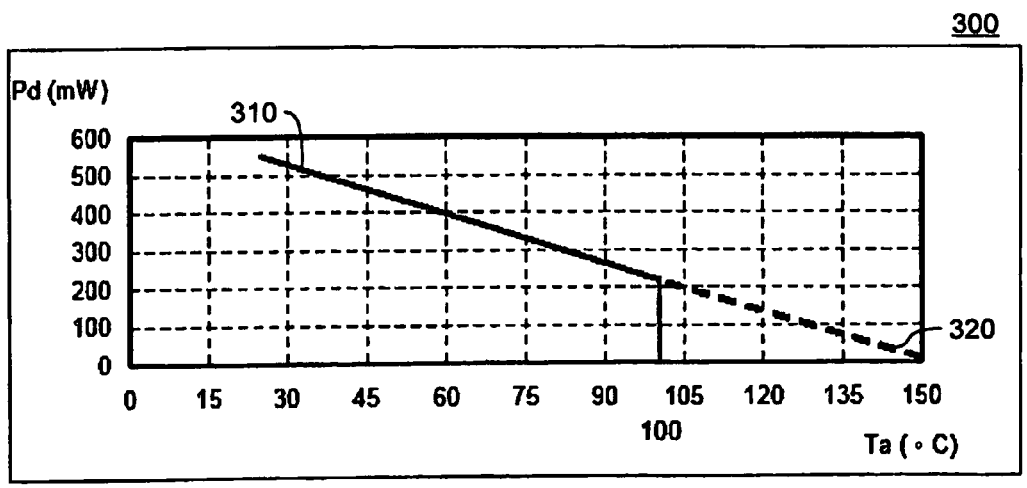
Figure 4:
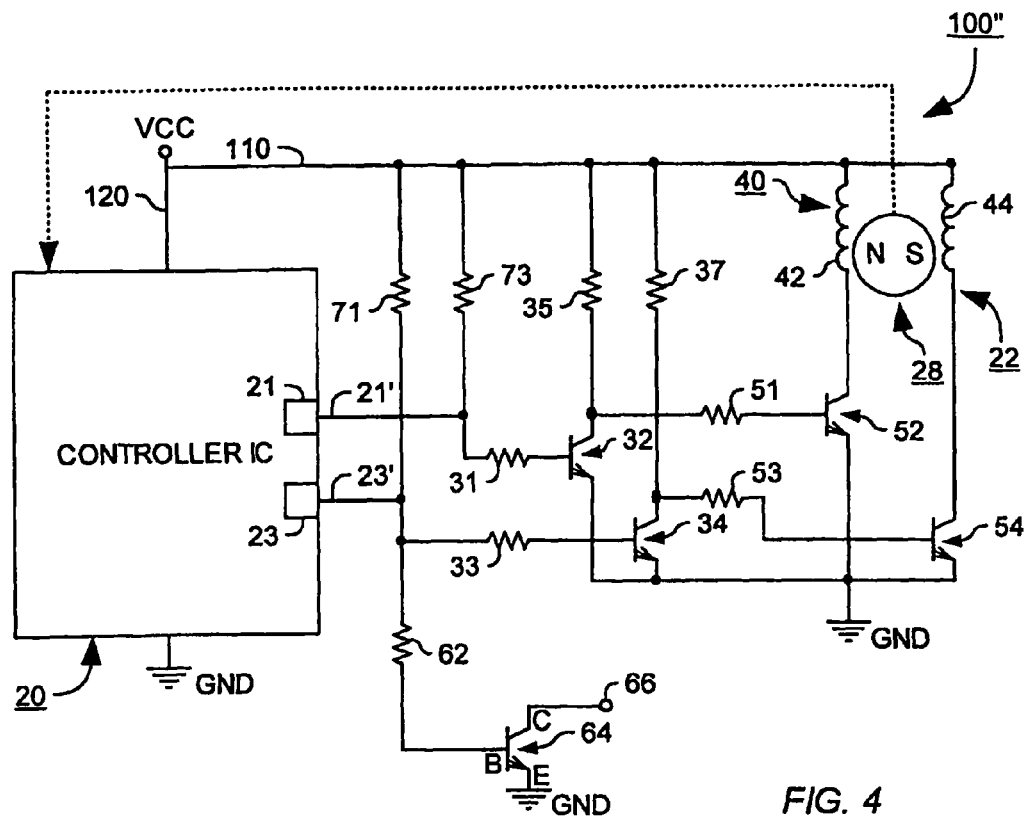
Figure 5:
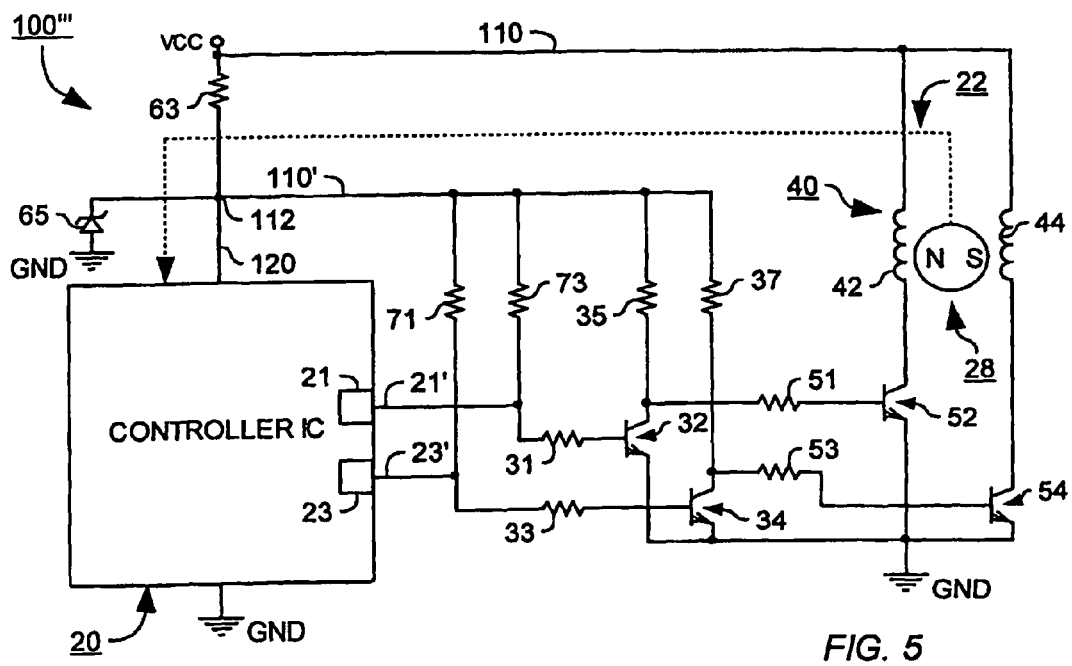

FIG. 3 schematically depicts a characteristic curve for the apparatus according to FIG. 1 or FIG. 2;

FIG. 4 is a circuit diagram of the apparatus of FIG. 1 having a rotation speed output, according to a refinement of the invention; and FIG. 5 is a circuit diagram of the apparatus according to FIG. 1 having an additional device for stabilizing the supply voltage.

DETAILED DESCRIPTION

In the description that follows, identical or identically functioning parts are labeled with the same reference characters in the various Figures, and usually are described only once.

FIG. 1 is a circuit diagram of an apparatus 100 for operating an ECM 22, which latter has a permanent-magnet rotor 28 and a stator winding arrangement 40. The latter is depicted, by way of example, in two-stranded fashion, i.e. having two winding strands 42, 44. These are connected on the one hand via a supply lead 110 to a DC voltage source VCC, and on the other hand to an external power stage 50. Voltage source VCC is connected via a supply lead 120 to a motor control module 20 (CONTROLLER IC). The ends of strands 42, 44 connected to supply lead 110 are referred to hereinafter as "upper" ends, whereas the ends connected to external power stage 50 are referred to as "lower" ends 43, 45.

External power stage 50 serves to influence the currents in winding strands 42, 44, and has two semiconductor switches that are depicted in FIG. 1 by way of example as bipolar transistors 52, 54. (A version having field effect transistors is also described later.) The collector of transistor 52 is connected to lower end 43 of strand 42, its emitter to ground (GND), and its base to an inversion logic unit 30. Analogously, the collector of transistor 54 is connected to lower end 45 of strand 44, its emitter to ground (GND), and its base to inversion logic unit 30. The latter serves to generate suitable commutation signals 51', 53' for external power stage 50, and has two semiconductor switches, which are depicted in FIG. 1 by way of example as bipolar transistors 32, 34, as well as eight resistors 31, 33, 35, 37, 51, 53, 71, 73. The collector of transistor 32 is connected via resistor 35 to supply lead 110, and via resistor 51 to the base of transistor 52. Its emitter is connected to ground (GND), and its base is connected via resistor 31 on the one hand to an open collector output 21 of motor control module 20 in order to deliver an output signal 21', and on the other hand via resistor 73 to lead 110.

Analogously, the collector of transistor 34 is connected via resistor 37 to lead 110, and via resistor 53 to the base of transistor 54. Its emitter is connected to ground, and its base is connected via resistor 33 on the one hand to open collector output 23 of motor control module 20 in order to deliver an output signal 23', and on the other hand via resistor 71 to lead 110.

The following are integrated into module 20 that is depicted:
- a Hall sensor 24 (HALL);
- a rotor position preparation unit 25 (HALL_PREP);
- an error logic unit 26 (ERROR LOGIC);
- an internal control logic unit 27 (CONTROL LOGIC) that is also responsible for current flow and commutation; and
- an output unit or internal power stage 29 (OC-OUT) having at least one open collector output.

Module 20 can be implemented as a space-saving motor control IC, which also exists as an Application-Specific Integrated Circuit (ASIC) module. Motor control ICs of this kind are available on the market, e.g. the AH287 of the Anachip company, or the PT3911 of Prolific Technology Inc. Modules 20 usually serve to connect lower ends 43, 45 of strands 42, 44 directly to open collector outputs 21, 23, and to generate corresponding output signals 21', 23' for current flow and commutation. They are available, for example, with a power rating of up to 2 watts and a voltage range between 2.8 V and 28 V.

Integrated Hall sensor (rotor position sensor) 24 is arranged in the magnetic field of rotor 28 in order to generate a rotor position signal 24' during operation. Alternatively, any rotor position sensor (including an external one) can also be used. This can be disadvantageous because such a sensor usually requires a capacitor in order to generate a stall clock cycle, with corresponding costs and a corresponding space requirement, as well as a stabilizing circuit for voltage stabilization in order to prevent overload and enable sufficiently precise measurement. It is likewise possible to sense the rotational position of rotor 28 using the so-called sensorless principle, as is known to one skilled in the art. In FIG. 1, Hall sensor 24 is depicted as an integrated component of module 20.

Rotor position signal preparation unit 25 serves to prepare rotor position signal 24' generated by Hall sensor 24, and it generates a rotor position signal 24". Control unit 27 generates, from rotor position signal 24", a signal 27' for applying control to power stage 29 with its power components, in order to produce commutation of and current flow in stator winding arrangement 40. In the arrangement according to FIG. 1, power stage 29 has two open collector outputs 21, 23. Other numbers of such outputs are possible.

Error logic unit 26 serves as stall protection for ECM 22, and switches it off in the event of an error, for example if rotor 28 is mechanically stalled. Error logic unit 26 generates, for this purpose, an error signal for control unit 27. The latter, on the basis of the error signal, generates the commutation signals in such a way that external power stage 50 is switched off. It is thus possible, for example if rotor 28 is stalled, to prevent overheating of ECM 22 due to continued current flow through stator winding arrangement 40, and to enable reliable restarting after the stall. Module 20, inversion logic unit 30 and external power stage 50 can be arranged together on a common circuit board, if appropriate.

Operation

During operation, motor control module 20 generates signals 21', 23' for ECM 22. For this purpose, Hall sensor 24 senses the rotational position of rotor 28 and generates a rotor position signal 24' that is prepared in unit 25. As a function of the prepared rotor position signal 24" and depending on the state of error unit 26, control signals 27' for internal power stage 29 are generated in control unit 27. Said power stage is controlled by control signals 27' in such a way that it generates signals for commutation of ECM 22, which are outputted via outputs 21, 23 as signals 21', 23'.

Open collector outputs 21, 23 enable a direct connection of lower ends 43, 45 of strands 42, 44. A logical LOW signal is therefore outputted at open collector output 21 when winding strand 42 is to receive current, i.e. output 21 is connected to ground GND. Analogously, a logical LOW signal is outputted at output 23 when winding strand 44 is to receive current; preferably, a logical LOW signal is outputted at no more than one of outputs 21, 23 at any moment.

In order to interrupt current flow in one or both winding strands 42, 44, a logical TRISTATE signal is generated at the associated output 21, 23, i.e. outputs 21, 23 are switched to high impedance so that no control current can be taken from them. An interruption of the current flow in both winding strands 42, 44 is necessary, inter alia, in the so-called current-flow gap and when rotor 28 is stalled (as described) in the event of a fault.

Because outputs 21, 23 are not connected directly to lower ends 43, 45 of the windings in the context of the circuits shown in FIGS. 1, 4, and 5, but instead are used to apply control to external power stage 50, 50', etc., output signals 21', 23' are inverted by inversion logic unit 30. The result is that output signal 21' generated at output 21 is inverted by transistor 32, and output signal 23' generated at output 23 is analogously inverted by transistor 34. A logical HIGH signal is generated at the collector of transistor 32 or 34, as a commutation signal for external power stage 50, when a logical LOW signal is present at the transistor's base, and vice versa.

Suitable switching thresholds and switch-on and switch-off times for transistors 32, 34 can be set by means of resistors 31, 33, 71, 73.

The signals generated at the collectors of transistors 32, 34 are the commutation signals for external power stage 50. These signals cause transistor 52 or 54 to become or be switched on when a logical HIGH signal is generated at its base (and thus at the collector of transistor 32 or 34, respectively). Switching on transistor 52 or 54 causes a current to flow through that transistor and through the associated winding strand 42 or 44, respectively. Conversely, transistor 52 or 54 becomes or is switched off when a logical LOW signal is generated at its base (and thus at the collector of transistor 32 or 34, respectively). Because a current through transistor 52 or 54 is thereby suppressed, current also does not flow through the associated strand 42 or 44, respectively. Current flow in both strands 42, 44 is correspondingly interrupted when both transistors 52, 54 are switched off.

Suitable switch-on and switch-off times for external power stage 50 are set by means of a delay member constituted by resistors 35, 37, 51, 53, which is depicted by way of example as an integrated constituent of inversion logic unit 30. Be it noted, however, that it can also be implemented as part of external power stage 50 or as a separate component. The delay member can be used to reduce voltages that would otherwise occur upon commutation in winding strands 42, 44.

With only a small number of components and thus at low cost, inversion logic unit 30 makes possible a connection (not actually intended) from external power stage 50 to internal power stage 29. Dividing the power dissipation between internal power stage 29 and external power stage 50 allows the motor to be operated even at higher temperatures, and in power output classes that are beyond the specification of the motor control module.

FIG. 2 is a partial depiction of an expanded variant 100' of apparatus 100 according to FIG. 1. This variant likewise has an ECM 22, a module 20, and an inversion logic unit 30. In contrast to FIG. 1, apparatus 100' has a voltage limiter 90 and a differently configured external power stage 50'.

Voltage limiter 90 serves to limit voltage spikes that are generated by an induced voltage that is induced in stator winding arrangement 40 upon commutation by external power stage 50'. This induced voltage produces a recharge current that is recharged into link circuit 110 and consequently to voltage limiter 90.

As FIG. 2 shows, voltage limiter 90 has a link circuit capacitor 92 and/or a Zener diode 94 or both. These are arranged parallel to one another between lead 110 and ground. Capacitor 92 serves to absorb the recharge current, and thus absorbs excess energy from strands 42, 44, thereby reducing corresponding voltage spikes. Zener diode 94 serves to protect link circuit capacitor 92, and limits a link circuit voltage present thereat. This protects the entire electronic system.

In contrast to external power stage 50 according to FIG. 1, external power stage 50' is depicted with two field effect transistors (FET) 52', 54' having internal recovery diodes 85, 86, respectively. In order to limit the drain voltage of these FETs 52', 54', external power stage 50' has a voltage limiting member having a plurality of elements that can be used separately from one another or in any desired combinations. The elements described below are accordingly to be regarded only as examples of suitable voltage limiters.

An effective voltage limiter can be implemented using Zener diodes 87, 88. The anode of Zener diode 87 is connected for this purpose to the source (S), and its cathode to the drain (D), of FET 52'. Analogously, the anode of Zener diode 88 is connected to the source (S) of FET 54'; its cathode is connected to the latter's drain. A further voltage limiter is implemented by a diode 89 whose anode is connected to the source terminals of both FETs 52', 54'. Its cathode is connected to ground. A further voltage limiter is realized by a circuit for slowing down the switching on and switching off of FETs 52', 54'. For this, the gate of transistor 52' is connected via a resistor 81 and a capacitor 83 (which form an RC element) to the drain of transistor 52'. The gate of FET 54' is connected via a resistor 82 to the anode of a Zener diode 84 whose cathode is connected to the drain of transistor 54'. The RC element and the resistor/Zener diode element are alternative possibilities for slowing down the switching-on and switching-off operations of transistors 52', 54'. An RC element or a resistor/Zener diode element can also be provided on both transistors 52', 54' in the context of the circuit according to FIG. 2.

It is evident to one skilled in the art that he need use only those of the components described in FIG. 2 and the following Figures that are necessary for the particular application.

FIG. 3 provides a schematic depiction 300 of an example of a characteristic curve 310 that depicts the outside or ambient temperature (Ta) permissible, as a function of a respectively occurring internal power dissipation (Pd) of motor control module 20, during the operation of apparatus 100 of FIG. 1 (or 100' of FIG. 2).

The internal power dissipation and the instantaneous ambient temperature result in heating of module 20, which can negatively affect the latter's proper operation. The temperature sensitivity of Hall sensor 24 is particularly critical here, since it can cause undefined switching of internal power stage 27 if the temperature is excessive. Characteristic curve 310 therefore indicates the ambient temperature at which the respectively occurring internal power dissipation Pd reaches its permissible maximum in terms of preventing excessive heating of module 20 and ensuring its proper operation.

In apparatus 100 of FIG. 1 and 100' of FIG. 2, only a relatively low power dissipation occurs in internal power stage 27, since the latter is not operating as a true power output stage. External power stage 50 (FIG. 1) or 50' (FIG. 2) is instead used for this purpose.

When characteristic curve 310 indicates, for example, that a maximum ambient temperature Ta of 100° C. is possible for module 20 when internal power stage 27 is operated as a power output stage and module 20 correspondingly generates an internal power dissipation of approximately 220 mW, a higher ambient temperature is therefore possible when external power stage 50 or 50' is used to reduce the internal power dissipation of module 20. This temperature can be determined, in consideration of a respectively determined specific internal power dissipation of module 20, from the dashed extension 320 of curve 310.

Because the power dissipation of internal power stage 27 is reduced, Hall sensor 24 can therefore be exposed to a higher ambient temperature without causing undefined switching as a result of excessive temperature sensitivity. Apparatus 100 according to FIG. 1, or 100' according to FIG. 2, can thus be operated at relatively high ambient temperatures.

FIG. 4 shows a variant 100" of apparatus 100 according to FIG. 1. This variant contains all the elements of apparatus 100 of FIG. 1. Apparatus 100" additionally has a rotation speed output 66, which is implemented here by way of example as an open collector output and is connected to the collector of a transistor 64 whose emitter is connected to ground (GND). The base of said transistor is connected via a resistor 62 to open collector output 23 of module 20 in order to generate, from the latter's output signal, a rotation speed signal.

FIG. 5 is a circuit diagram of another variant 100''' that once again contains all the elements of apparatus 100 (FIG. 1).

In contrast to FIG. 1, in this case supply lead 110 is directly connected only to the upper ends of winding strands 42, 44. Resistors 35, 37, 71, 73 are connected to an additional supply lead 110' that has a node 112 which is connected via a resistor 63 to supply lead 120 for IC 20. Node 112 is also connected to the cathode of a Zener diode 65 whose anode is connected to ground. Resistor 63 and diode 65 constitute a device for stabilizing supply voltage V, for module 20. Thanks to this circuit, module 20 can also be used for motors that are operated with a higher operating voltage (UB_Motor >>UB_Motor control module).

If module 20 requires higher currents for its operation, i.e. for example, currents of more than 15 mA, this stabilization device can be implemented using a Zener diode and a series transistor that are suitable for handling such higher currents. Here as well, the stabilization outlay is very small, since the current consumed by the motor control module is very low as compared with the motor current. If, conversely, the internal power stage of the motor control module were used, the entire motor current would also need to be stabilized.

Numerous variants and modifications are of course possible within the scope of the present invention.

What is claimed is:

1. An electronically commutated motor (100, 100', 100", 100''') that comprises
    a permanent-magnet rotor (28);
    a stator having a stator winding arrangements (40);
    an external power stage (50) for influencing current flow in the stator winding arrangement (40); and
    an integrated motor control module (20) implemented as an integrated circuit (IC),
    wherein
    said module has a control logic unit ((27) and an internal power stage (29) that has at least one open collector output (21, 23), the control logic unit (27) being configured to process at least one rotor position signal (24', 24") and to generate therefrom at least one control signal (27') for the internal power stage (29), which at least one control signal (27') serves to apply control to the internal power stage (29) in order to generate an output signal (21', 23') at the at least one open collector output (21, 23) of the motor control module (20);
    said external power stage (50), is separate from the motor control module (20), for influencing the current flow in the stator winding arrangement (40); and further comprising
    an inversion logic unit (30) that is configured to reshape the output signal (21', 23') generated at the at least one open collector output (21, 23) for the purpose of generating commutation signals (51', 53') for the external power stage (50).

2. The electric motor according to claim 1, wherein
    the inversion logic unit (30) is configured, when a logical LOW signal is present at an open collector output (21, 23), to generate a commutation signal (51', 53') in such a way that the external power stage (50) produces a current flow through the stator winding arrangement (46).

3. The electric motor according to claim 2, wherein
the motor control module comprises two open collector outputs (21, 23) and
the internal power stage (29) is configured to generate a logical LOW signal at no more than one of the two open collector outputs (21, 23) in each case.

4. The electric motor according to claim 1, wherein
the inversion logic unit (30) is configured, when a logical TRISTATE signal is present at an open collector output (21, 23), to generate a commutation signal (51', 53') in such a way that the external power stage (50) interrupts current flow in the stator winding arrangement (46).

5. The electric motor according to claim 1, wherein
the motor control module comprises two open collector outputs (21, 23) and
the internal power stage (29) is configured to generate a logical LOW signal at no more than one of the two open collector outputs (21, 23) in each case.

6. The electric motor according to claim 5, wherein
the stator winding arrangement (40) comprises two winding strands (42, 44), one of the two open collector outputs (21, 23) being associated with each of said winding strands, and
the inversion logic unit (30) is configured, when the logical LOW signal is present at the relevant open collector output (21, 23), to generate the commutation signals (51', 53') in such a way that a current flow, in the winding strand (40, 44) associated with the relevant open collector output (21, 23), is effected by the external power stage.

7. The electric motor according to claim 5, wherein
the inversion logic unit (30) is configured, when a logical TRISTATE signal is present at the open collector outputs (21, 23), to generate the commutation signals (51', 53') in such a way that the external power stage (50) interrupts the associated current through the stator winding arrangement (40).

8. The electric motor according to claim 1, wherein
the inversion logic unit (30) comprises at least one semiconductor switch (32, 34) that is configured to reshape the output signal (21', 23') generated at the at least one open collector output (21, 23) into an inverted signal (51', 53').

9. The electric motor according to claim 1, wherein
the inversion logic unit (30) has, associated with it, a delay member (35, 37, 51, 53) for influencing the switching times of the external power stage (50).

10. The electric motor according to claim 9, wherein
the delay member (35, 37, 51, 53) is configured to influence the switching-on and switching-off times of the external power stage (50) in such a way that during operation, at least one voltage induced in the stator winding arrangement (40) is reduced.

11. The electric motor according to claim 1,
which comprises an arrangement (90) for limiting voltage spikes that occur, during operation, in the stator winding arrangement (40).

12. The electric motor according to claim 11,
wherein the arrangement (90) for voltage limitation (90) comprises a link circuit capacitor (92) for absorbing a recharge current that occurs during operation of the motor.

13. The electric motor according to claim 1, wherein
the external power stage (50, 50') comprises at least one field effect transistor (52', 54') as a power stage semiconductor switch.

14. The electric motor according to claim 13, wherein
the external power stage (50, 50') comprises a voltage limiting member for limiting the drain voltage of the field effect transistor (52', 54').

15. The electric motor according to claim 14,
wherein the voltage limiting member comprises at least one Zener diode (87, 88).

16. The electric motor according to claim 15, wherein
the voltage limiting member comprises a diode (89).

17. The electric motor according to claim 15, wherein
the voltage limiting member comprises a circuit (81, 83, 82, 84) for slowing down switching-on and switching-off operations of the field effect transistor (52', 54').

18. The electric motor according to claim 14, wherein
the voltage limiting member comprises a circuit (81, 83, 82, 84) for slowing down switching-on and switching-off operations of the field effect transistor (52', 54').

19. The electric motor according to claim 18, wherein
the voltage limiting member comprises a diode (89).

20. The electric motor according to claim 1, wherein
a device (63, 65) for stabilizing a supply voltage for the motor control module (20) is provided.

21. The electric motor according to claim 1,
which comprises a stall protector (26) that causes a shutoff of the motor in the event of a fault.

22. The electric motor according to claim 1, wherein
a signal at at least one open collector output (21, 23) serves to generate a rotation speed signal.

23. The electric motor according to claim 1, wherein
the motor control module (20) comprises a Hall sensor (24) that is arranged in the magnetic field of the permanent-magnet rotor (28).

24. The electric motor according to claim 1, wherein
the integrated motor control module is implemented as an application specific integrated circuit.

25. The electric motor according to claim 1, wherein
the integrated motor control module (20), the inversion logic unit (30), and the external power stage (50) are arranged together on a common circuit board.

* * * * *